(12) United States Patent
Murahari et al.

(10) Patent No.: US 9,671,466 B2
(45) Date of Patent: Jun. 6, 2017

(54) ARC FAULT CIRCUIT INTERRUPTER TEST APPARATUS AND METHODS

(71) Applicant: Eaton Corporation, Cleveland, OH (US)

(72) Inventors: Saivaraprasad Murahari, Peachtree City, GA (US); Tom Xiong, Shanghai (CN); Jackie Hao, Suzhou (CN)

(73) Assignee: Eaton Corporation, Cleveland, OH (US)

( * ) Notice: Subject to any disclaimer, the term of this patent is extended or adjusted under 35 U.S.C. 154(b) by 2 days.

(21) Appl. No.: 14/862,879

(22) Filed: Sep. 23, 2015

(65) Prior Publication Data

US 2017/0082691 A1   Mar. 23, 2017

(51) Int. Cl.
*G01R 31/327*   (2006.01)

(52) U.S. Cl.
CPC ................... *G01R 31/3275* (2013.01)

(58) Field of Classification Search
CPC combination set(s) only.
See application file for complete search history.

(56) References Cited

U.S. PATENT DOCUMENTS

| | | | |
|---|---|---|---|
| 6,072,317 A | 6/2000 | Mackenzie | |
| 6,218,844 B1 | 4/2001 | Wong et al. | |
| 6,313,642 B1 | 11/2001 | Brooks | |
| 6,876,204 B2 | 4/2005 | Smith | |
| 2009/0189615 A1* | 7/2009 | Kinsel | G01R 31/3277 324/537 |
| 2015/0192630 A1* | 7/2015 | Tsukamoto | G01R 31/025 324/426 |

\* cited by examiner

*Primary Examiner* — Clayton E Laballe
*Assistant Examiner* — Jas Sanghera
(74) *Attorney, Agent, or Firm* — Myers Bigel, P.A.

(57) ABSTRACT

An apparatus for testing an arc fault circuit interrupter includes an AC signal generator circuit configured to be capacitively coupled to an AC power line and to induce an AC signal thereon and a control circuit configured to control the AC signal generator circuit to selectively enable and disable generation of the AC signal responsive to a waveform of an AC power voltage of the AC power line.

14 Claims, 7 Drawing Sheets

ARC FAULT CIRCUIT INTERRUPTER TEST APPARATUS AND METHODS

BACKGROUND

The inventive subject matter relates to testing apparatus and methods for electrical circuit components and, more particularly, to testing apparatus and methods for circuit interruption devices.

A wide variety of different types of circuit interruption devices are used in electrical power distribution systems. Arc fault circuit interruption (AFCI) devices have been developed to provide protection against arc faults, which are intermittent high impedance faults that can be cause by such things as worn insulation, loose connections, and broken conductors. Because of their intermittent and high impedance nature, arc faults may not generate current of sufficient magnitude to trigger thermal-magnetic circuit interruption devices. However, arc faults are a major cause of electrical wiring fires, so AFCI devices are now required for residential wiring applications. Commonly used AFCI devices included panel-mounted circuit breakers and circuit-interrupting receptacles.

Certification standards require testing of an AFCI device before installation (e.g., as part of the manufacturing process) to verify that the device is operating properly. It is also desirable to periodically test an installed AFCI device to verify continued protection. Examples of different testers developed for AFCI devices are described in U.S. Pat. No. 6,072,317, U.S. Pat. No. 6,218,844, U.S. Pat. No. 6,313,642, and U.S. Pat. No. 6,876,204.

SUMMARY

Some embodiments of the inventive subject matter provide an apparatus for testing an arc fault circuit interrupter. The apparatus includes an AC signal generator circuit configured to be capacitively coupled to an AC power line and to induce an AC signal thereon and a control circuit configured to control the AC signal generator circuit to selectively enable and disable generation of the AC signal responsive to a waveform of an AC power voltage of the AC power line.

In some embodiments, the AC signal generator circuit may include a switch configured to selectively couple the AC line to a ground node via a capacitor responsive to a switch control signal and a drive circuit configured to generate the switch control signal responsive to an oscillating signal. The AC signal generator circuit may further include a signal generator circuit configured to generate the oscillating signal. The control circuit may be configured to enable and disable the signal generator circuit to enable and disable generation of the AC signal on the AC power line. The control circuit may be configured to enable and disable a power supply to the signal generator circuit to enable and disable generation of the AC signal on the AC power line.

In some embodiments, the control circuit may include a zero crossing detector circuit configured to detect zero crossings of the AC voltage on the AC power line and a blanking circuit configured to enable and disable generation of the AC signal based on the detected zero crossings. The blanking circuit may be configured to disable generation of the AC signal for a predetermined time interval before and/or after a detected zero crossing.

In some embodiments, the control circuit may be configured to detect first and second immediately successive zero crossings of an AC power voltage of the AC power line and to disable generation of the AC signal for respective first and second time intervals responsive to respective ones of the first and second detected zero crossings.

Further embodiments provide an arc fault circuit interrupter testing apparatus including an AC signal generator circuit configured to be coupled to an AC power line and to induce an AC signal thereon and a control circuit configured to detect first and second immediately successive zero crossings of an AC power voltage of the AC power line and to disable generation of the AC signal for respective first and second time intervals responsive to respective ones of the first and second detected zero crossings. The AC signal generator circuit may include a switch configured to selectively couple the AC line to a ground node via a capacitor responsive to a switch control signal and a drive circuit configured to generate the switch control signal responsive to an oscillating signal.

The AC signal generator circuit may further include a signal generator circuit configured to generate the oscillating signal. The control circuit may be configured to enable and disable the signal generator circuit to enable and disable generation of the AC signal on the AC power line. The control circuit may be configured to enable and disable a power supply to the signal generator circuit to enable and disable generation of the AC signal on the AC power line. The control circuit may include a zero crossing detector circuit configured to detect the first and second zero crossing, a pulse generation circuit configured to generate first and second pulses responsive to respective ones of the first and second zero crossings, and a switching circuit configured to decouple a power supply input of the signal generator circuit from a power source responsive to the first and second pulses.

Further embodiments provide methods of testing an arc fault circuit interrupter. The methods include capacitively coupling an AC signal generator circuit to an AC power line to induce an AC signal thereon and selectively enabling and disabling generation of the AC signal responsive to a waveform of an AC power voltage of the AC power line. The methods may further include detecting first and second immediately successive zero crossings of an AC power voltage of the AC power line and wherein selectively enabling and disabling generation of the AC signal responsive to the waveform of the AC power voltage of the AC power line may include disabling generation of the AC signal for respective first and second time intervals responsive to respective ones of the first and second detected zero crossings.

DETAILED DESCRIPTION

Figure 1:
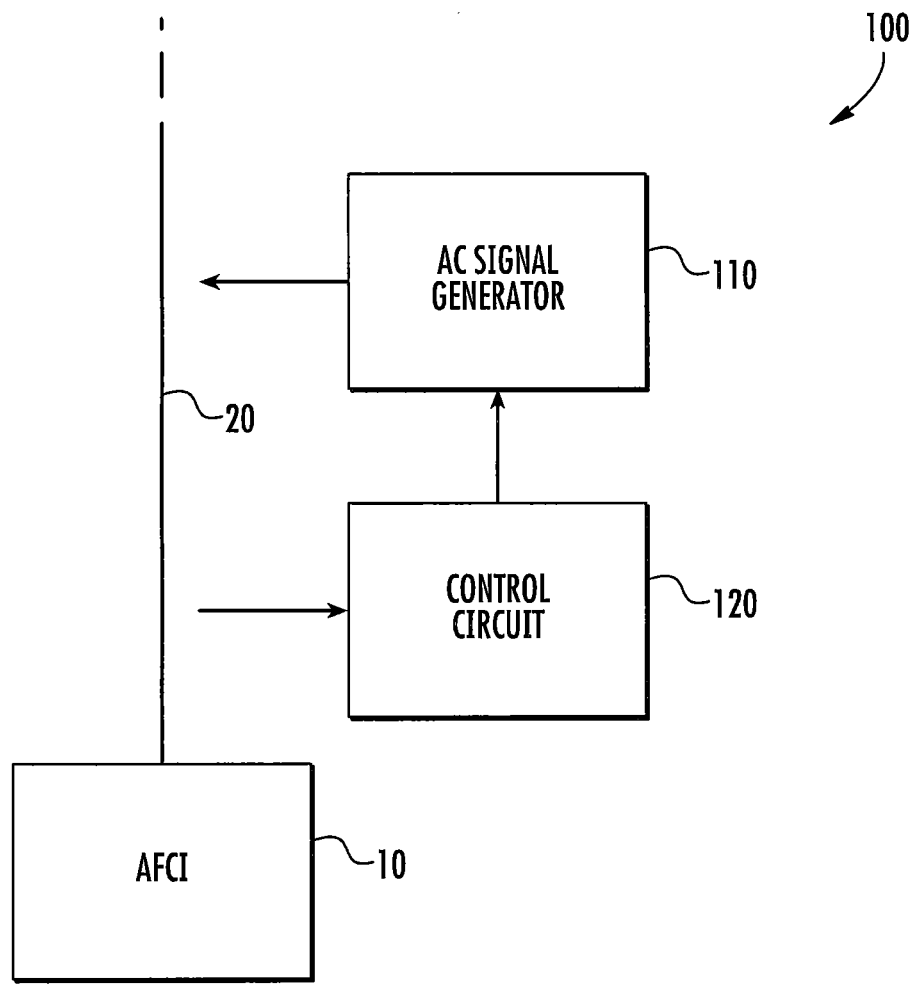
FIG. 1 is a schematic diagram illustrating a test apparatus for an AFCI device according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/ or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

FIG. 1 illustrates a test apparatus 100 according to some embodiments. The test apparatus 100 is configured to test an AFCI device 10 coupled to an AC power line 20. The test apparatus 100 includes an AC signal generator circuit 110 which is configured to generate an AC signal on the AC power line 20. In some embodiments, the AC signal induced by the AC signal generator circuit 110 is an AC signal having a substantially higher frequency (e.g., several MHz) than the fundamental frequency of an AC power voltage waveform on the AC power line 20 (e.g., 60 Hz). The AC signal generator circuit 110 is controlled by a control circuit 120 responsive to the AC power voltage waveform on the AC power line 20. In some embodiments, for example, the control circuit may be configured to enable and disable generation of the AC signal by the AC signal generator circuit 110 such that, for example, the AC signal is blanked near zero crossings of the AC power voltage waveform. This blanking may enable the induced high-frequency AC voltage to mimic a waveform signature of an arc fault that the AFCI device 10 is designed to detect. In some embodiments, the blanking may be user adjustable. In further embodiments, the frequency of the high-frequency AC voltage and/or the blanking intervals thereof may also be adjustable, to allow the testing apparatus 100 to be tailored to the behavior of various different types of AFCI devices. The testing apparatus 100 may be implemented in any of a number of different types of equipment, such as in factory testing equipment and/or portable devices for use by electricians, inspectors, or similar personnel.

Figure 2:
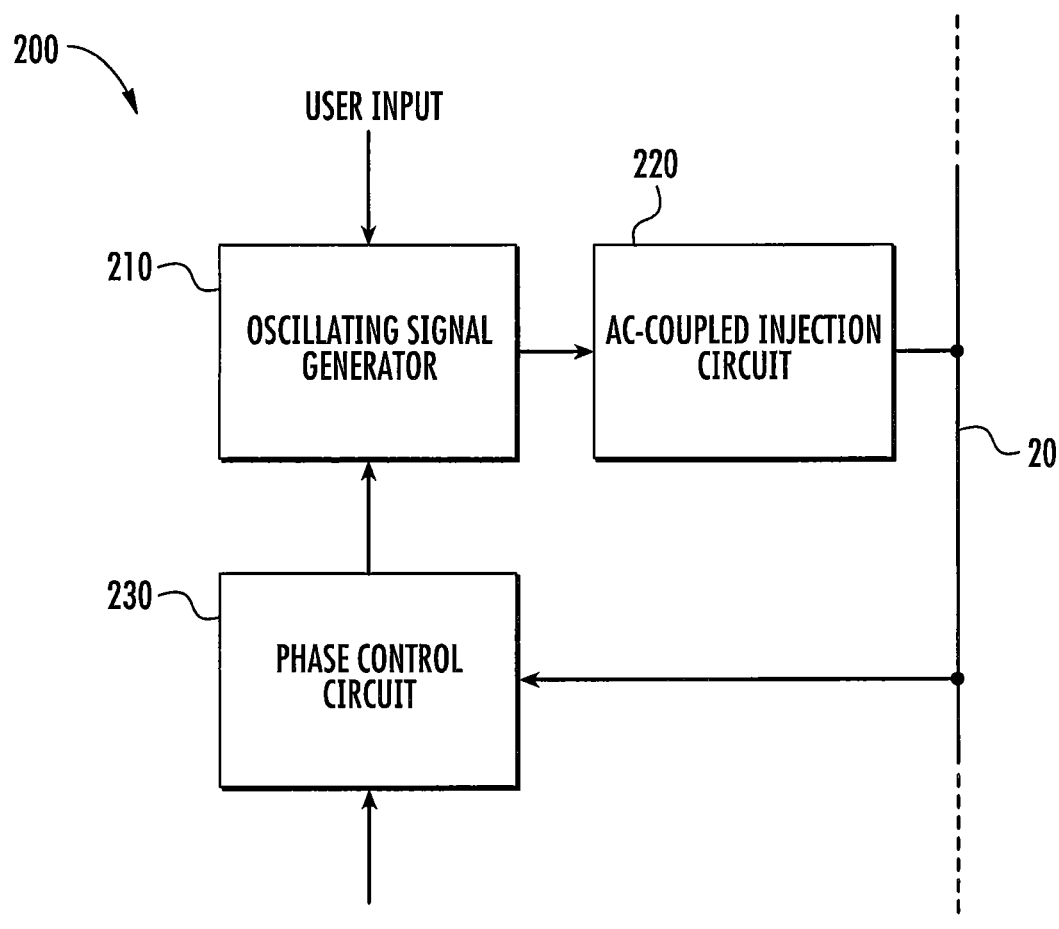
FIG. 2 is a schematic diagram illustrating a test apparatus for an AFCI device according to further embodiments.

FIG. 2 illustrates an AFCI testing apparatus 200 according to further embodiments. The apparatus 200 includes an AC coupled injection circuit 220 which is configured to induce a relatively high-frequency AC signal on an AC power line 20 via a capacitive coupling. The injection circuit 220 is driven by an oscillating signal generated by an oscillating signal generator circuit 210. As shown, the oscillating signal may have a frequency that is user adjustable. Phase control of the oscillating signal may be provided by a phase control circuit 230, which is configured to enable and disable the oscillating signal generator circuit 210 responsive to an AC power voltage waveform on the AC power line 20. The enabling and disabling of the oscillating signal generator circuit 230 may also be user adjustable.

Figure 3:
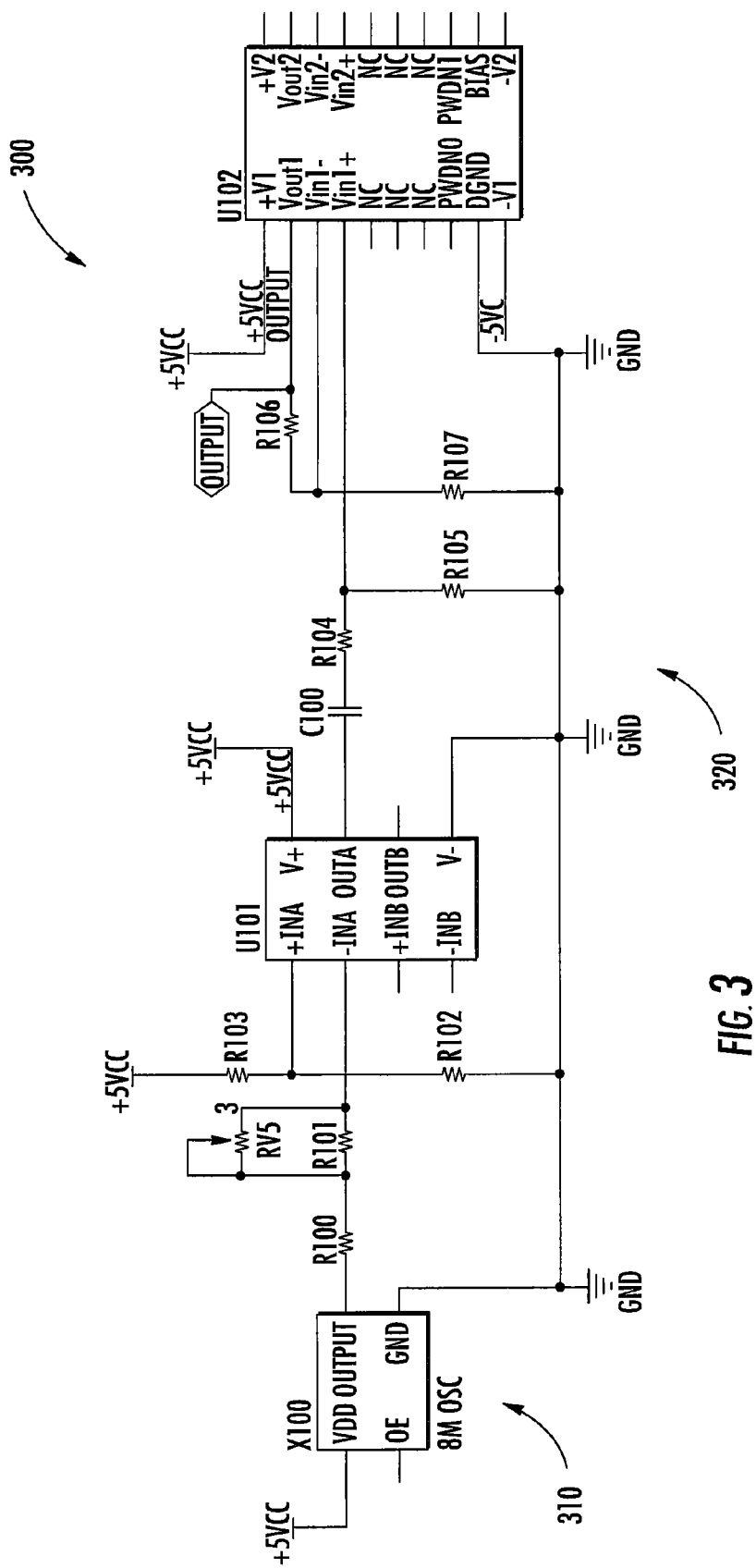
FIG. 3 is a schematic diagram illustrating a signal generator circuit of a test apparatus according to some embodiments.

FIGS. 3-7 are detailed schematic diagrams illustrating exemplary circuits for implementing the apparatus 200 of FIG. 2. Referring to FIG. 3, and oscillating signal generator circuit 300 includes an oscillator, here shown as an 8 MHz crystal oscillator 310. An oscillating signal produced by the oscillator 310 is provided to signal processing circuit 320 including a first signal processing circuit including resistors R100, R101, R102, R103, and a comparator circuit U101. An output of the comparator circuit U101 is provided to align driver circuit U102 via a filter network including a capacitor C100, and resistors R104, R105, R106, R107.

Figure 4:
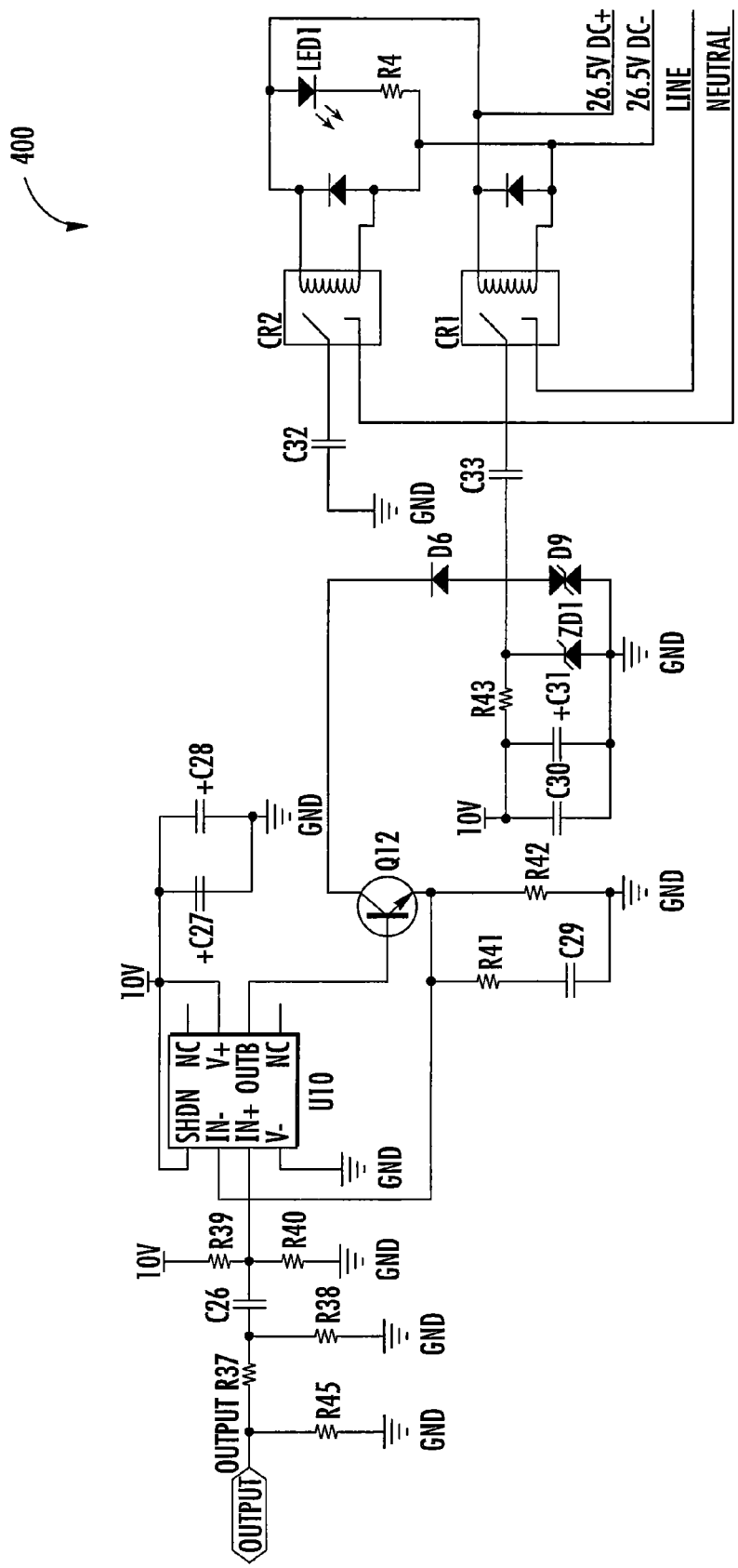
FIG. 4 is a schematic diagram illustrating a signal injection circuit of the test apparatus according to some embodiments.

Referring to FIG. 4, signal injection circuit 400 is configured to be coupled to line and neutral conductors of an AC power line via relays CR1, CR2. As shown, the relays CR1, CR2 may be driven by a 26.5 V DC signal, with an indicator circuit including an LED LED1 and a resistor R44 providing an indication when the relays CR1, CR2 are in a closed state.

The signal injection circuit 400 receives an output signal of the driver circuit U102 of the oscillating signal generator circuit 300. The signal is filtered by a circuit including resistors R37, R38, R45 and a capacitor C26, with the filtered signal being applied to an amplifier circuit including a current feedback operational amplifier U10 resistors R39, R40 and capacitors C27, C28. The amplifier circuit drives a power transistor Q12, with current feedback provided by a current sensor circuit including resistors R41, R42 and a capacitor C29. The transistor Q12 is capacitively coupled to the first relay CR1 and, thus, the AC line via a capacitor C33 and a diode D6. Overvoltage protection is provided by a protection circuit including a senior diode ZD1, a transient voltage suppressor D9, capacitors C30, C31, and a resistor R43. The signal injection circuit 400 is configured to induce a high-frequency signal with a desired amplitude on the AC power line, without introducing any significant DC bias.

Figure 5:
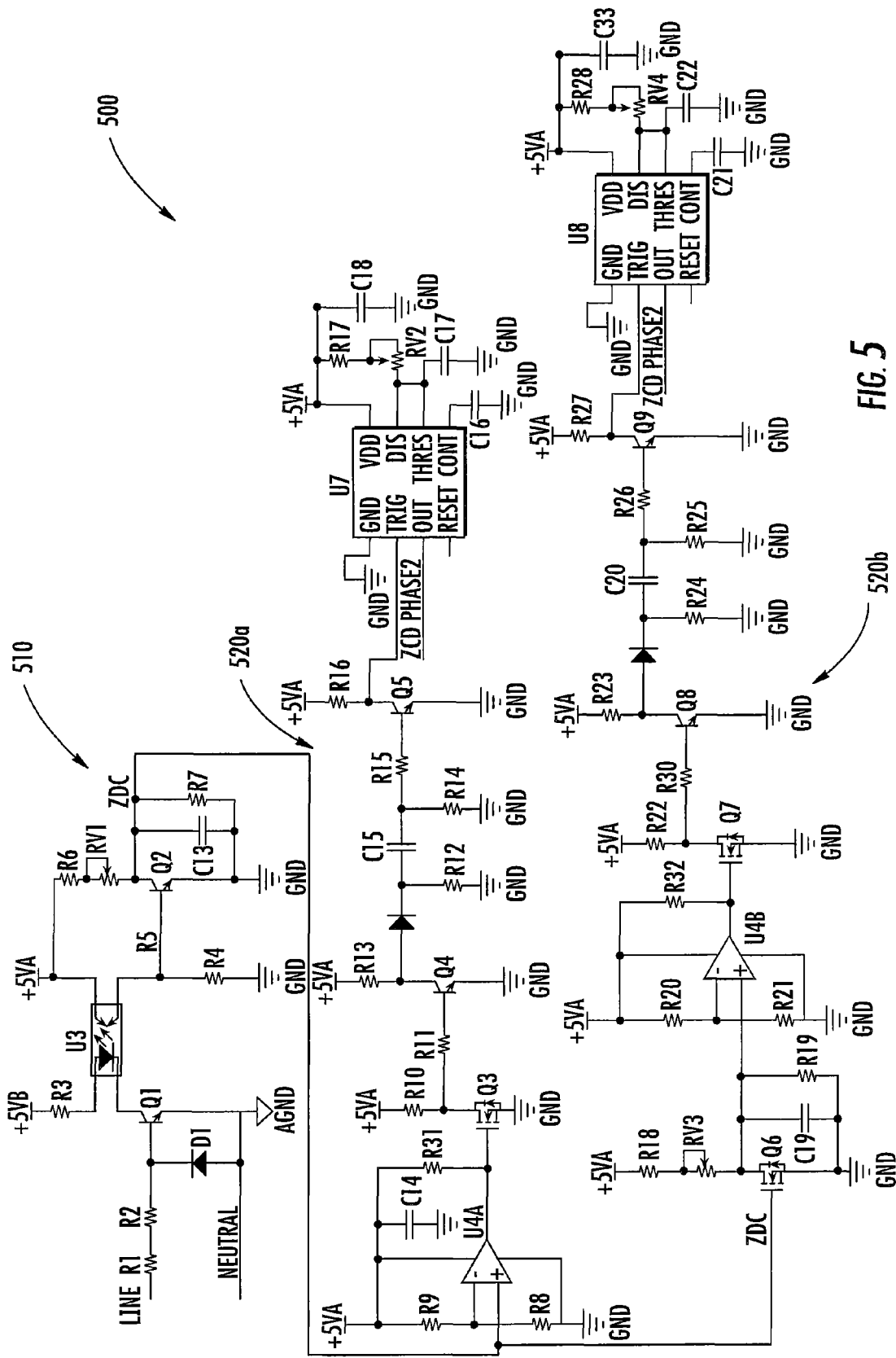
FIG. 5 is a schematic diagram illustrating a phase control circuit of the test apparatus according to some embodiments.

FIG. 5 illustrates a phase control circuit 500. The phase control circuit is configured to generate first and second pulse signals ZCD Phase1, ZCD Phase2 that are used to enable and disable the oscillating signal generator circuit 300 of FIG. 3 near zero crossings of the AC power voltage waveform. Line and neutral conductors of the AC power line are coupled to the phase control circuit 500 using an optical isolation circuit 510 including an optoisolator U3, a transistor Q2, resistors R1, R2, R3, R4, R5, R6, R7, a diode D1, capacitor C13, and an adjustable resistor RV1. A signal ZDC produced by the optical isolation circuit 510 is provided to first and second pulse generation circuits 520a, 520b. A delay of the signal ZDC with respect to zero crossings of the AC power voltage waveform may be adjusted using the adjustable resistor RV1.

The first pulse generation circuit 520*a* includes a comparator U4A, transistors Q3, Q4, Q5, a one-shot multi-vibrator U7, resistors R8, R9, R10, R11, R12, R13, R14, R15, R16, R17, R31, capacitors C14, C15, C16, C17, C18, a diode D2, and an adjustable resistor RV2. The first pulse generation circuit 520*a* is configured to provide a trigger signal (a negative going edge) to the one-shot U7 responsive to a positive going zero crossing of the AC power line voltage, which produces the first pulse signal ZDC Phase1. A pulse duration of the first pulse signal ZDC Phase1 may be adjusted using the adjustable resistor RV2.

The second pulse generation circuit 520*b* includes a comparator U4B, transistors Q6, Q7, Q8, Q9, a one-shot multi-vibrator U8, resistors R18, R19, R20, R21, R22, R23, R24, R25, R26, R27, R28, R32, capacitors C19, C20, C21, C22, C23, a diode D3, and adjustable resistors RV3, RV4. The second pulse generation circuit 520*ba* is configured to provide a trigger signal (a negative going edge) to the one-shot U8 responsive to a negative going zero crossing of the AC power line voltage, which produces the second pulse signal ZDC Phase2. A pulse duration of the second pulse signal ZDC Phase2 may be adjusted using the adjustable resistor RV4.

Figure 6:
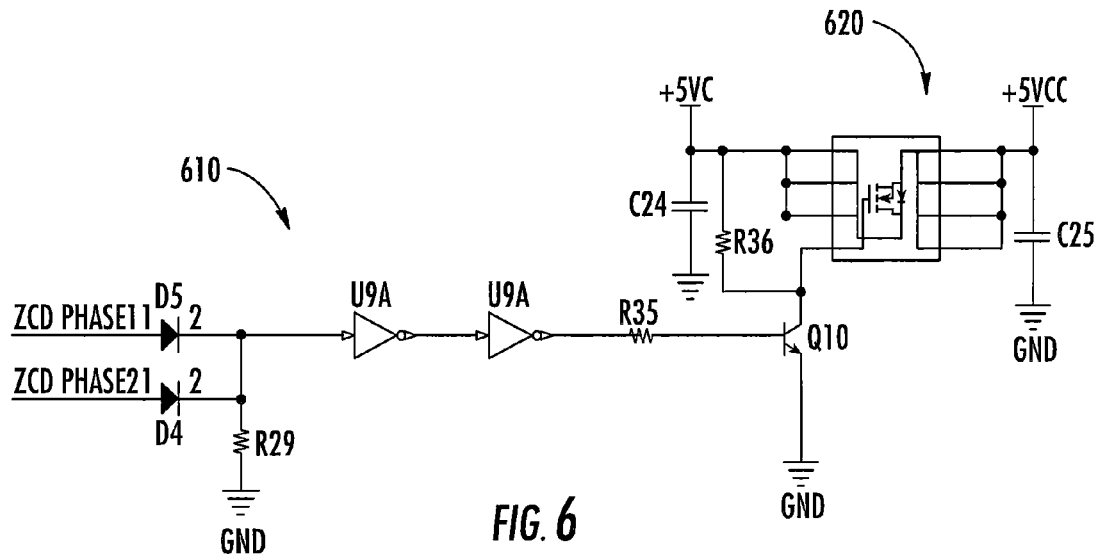
FIG. 6 is a schematic diagram illustrating a circuit for enabling and disabling the signal generator circuit of FIG. 3.

Referring to FIG. 6, the first and second pulse signals ZDC Phase1, ZDC Phase2 are provided to a driver circuit 610 including diodes D4, T5, inverters U9A, U9B, a transistor Q10, and resistors R29, R35, R36. The driver circuit 610 is configured to control a switching circuit 620 including a transistor Q11 that couples a first 5V DC power supply node +5VC to a second 5V DC power supply node +5VCC to selectively provide power to the oscillating signal generator circuit 300 of FIG. 3. The first and second pulse signals ZDC Phase1, ZDC Phase2 disable the oscillating signal generator circuit 300 by turning off the transistor Q11, thus providing blanking of the oscillating signal produced by the oscillating signal generator circuit 300 near zero crossings of the AC power line voltage. This blanking causes the high-frequency signals generated on the AC power line to mimic behavior of high-frequency signals commonly associated with arc faults.

Figure 7:
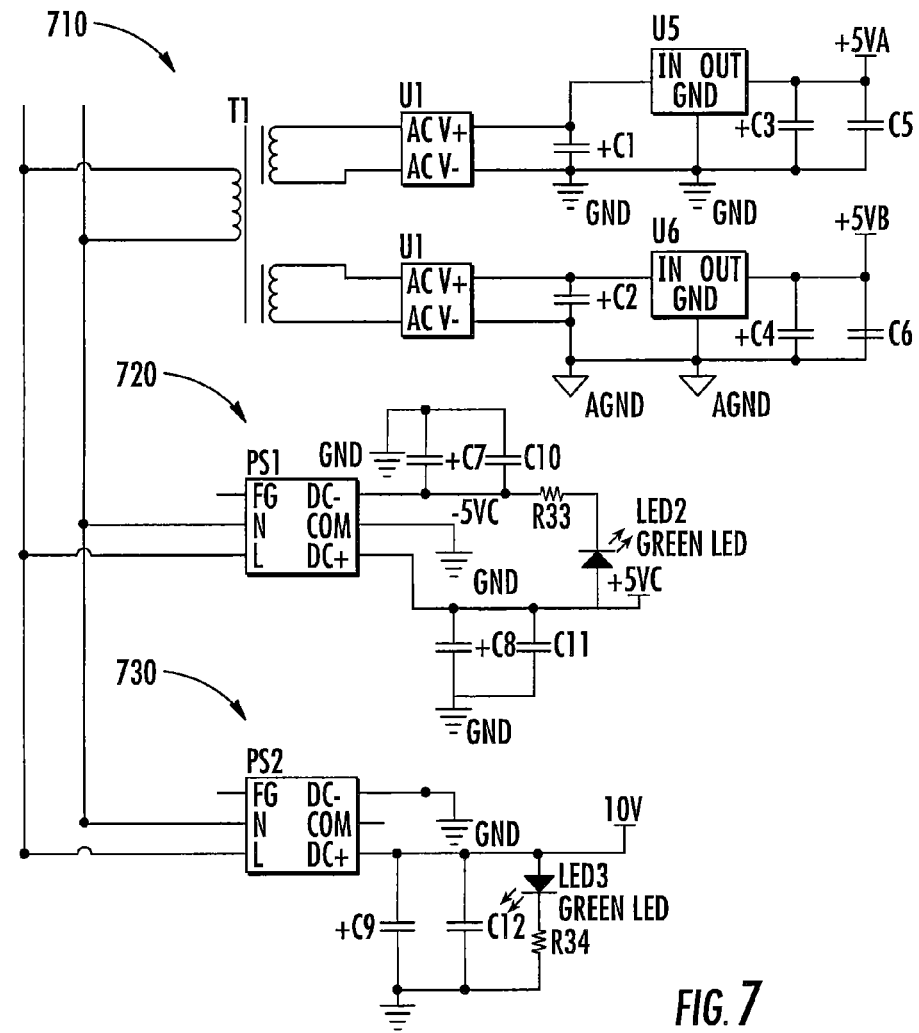
FIG. 7 is a schematic diagram illustrating power supply circuitry of the test apparatus according to some embodiments.

FIG. 7 illustrates power supply circuitry for providing power to the circuits shown in FIGS. 3-6. A first power supply circuit 710 is coupled to line and neutral conductors of the AC power line and includes an isolating transformer T1, first and second bridge rectifiers U1, U2, low dropout regulators U5, U6, and capacitors C1, C2, C3, C4, C5, C6. The first power supply circuit 710 is designed to provide 5V power at first and second power supply nodes +5VA, +5VB used by the phase control circuit 500.

A second power supply circuit 720 includes a DC power supply module PS1, capacitors C7, C8, C10, C11 and a resistor R33. The DC power supply module PS1 is configured to provide 5V power at a third power supply node +5VC used by the switching circuit 620. An LED LED 2 may be used to indicate activation of this power supply.

A third power supply circuit 730 includes a DC power supply module PS2, capacitors C9, C12, and a resistor R34. The DC power supply module PS2 is configured to provide 10V power at a fourth power supply node +10V used by the signal injection circuit 400. An LED LED3 may be used to indicate activation of this power supply.

It will be appreciated that the circuitry described above with reference to FIGS. 3-7 represents an exemplary implementation, and that other circuit arrangements may be used in other embodiments. For example, although the oscillating signal generation circuit 300 of FIG. 3 uses a fixed 8 MHz oscillator, it will be understood that some embodiments may use oscillators generating signals with other frequencies and/or adjustable frequency oscillators, such as a voltage-controlled oscillator (VCOs) or a microprocessor-based oscillating signal generator (e.g., a microcontroller).

Figure 8:
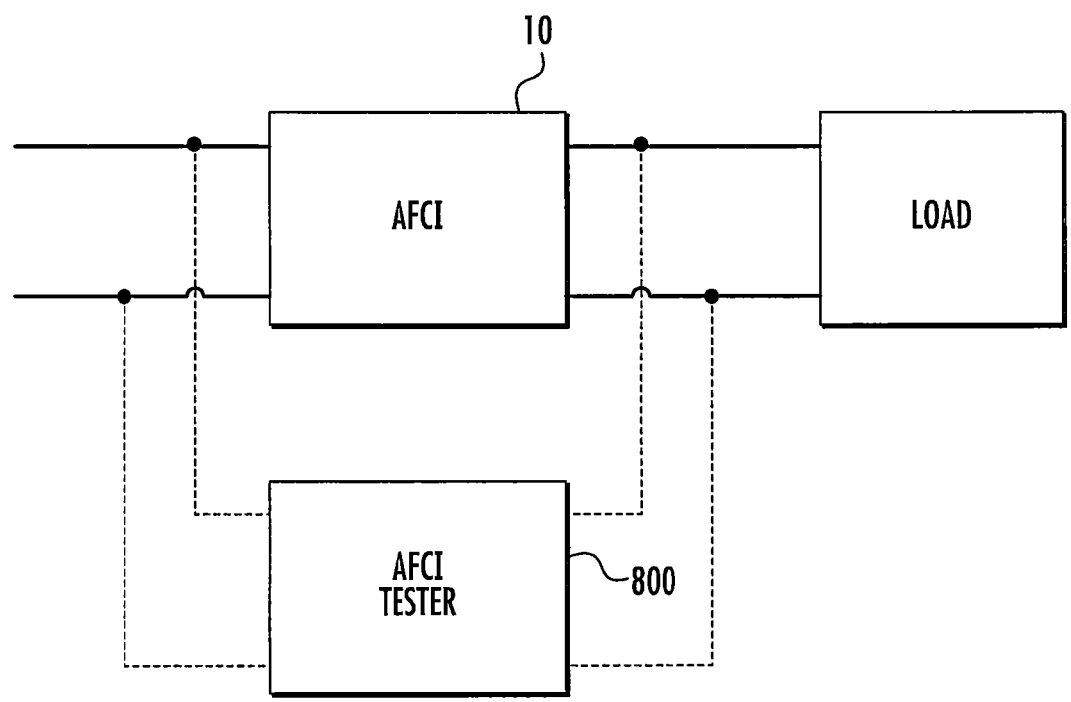
FIG. 8 is a schematic diagram illustrating applications of a test apparatus according to some embodiments.

The circuitry described above may be implemented in testing equipment, such as factory test equipment used to test AFCI devices as part of the manufacturing process, and/or in test equipment used to test AFCI devices in the field after installation. As shown in FIG. 8, such a tester 800 may be used to test and AFCI device 10 by injecting a high-frequency AC signal as described above on either a load side or a line side of the AFCI device 10.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus for testing an arc fault circuit interrupter, the apparatus comprising:
an AC signal generator circuit configured to be capacitively coupled to an AC power line and to induce an AC signal thereon, said AC signal generator circuit comprising: a switch configured to selectively couple the AC power line to a ground node via a capacitor responsive to a switch control signal, and a drive circuit configured to generate the switch control signal responsive to an oscillating signal; and
a control circuit configured to control the AC signal generator circuit to selectively enable and disable generation of the AC signal responsive to a waveform of an AC power voltage of the AC power line.

2. The apparatus of claim 1, wherein the AC signal has a frequency substantially greater than a fundamental frequency of the AC power voltage.

3. The apparatus of claim 1, wherein the AC signal generator circuit further comprises a signal generator circuit configured to generate the oscillating signal.

4. The apparatus of claim 3, wherein the control circuit is configured to enable and disable the signal generator circuit to enable and disable generation of the AC signal on the AC power line.

5. The apparatus of claim 4, wherein the control circuit is configured to enable and disable a power supply to the signal generator circuit to enable and disable generation of the AC signal on the AC power line.

6. The apparatus of claim 1, wherein the control circuit comprises:
a zero crossing detector circuit configured to detect zero crossings of the AC power voltage on the AC power line;
a blanking circuit configured to enable and disable generation of the AC signal based on the detected zero crossings.

7. The apparatus of claim 6, wherein the blanking circuit is configured to disable generation of the AC signal for a predetermined time interval before and/or after a detected zero crossing.

8. The apparatus of claim 1, wherein the control circuit is configured to detect first and second immediately successive zero crossings of the AC power voltage of the AC power line and to disable generation of the AC signal for respective first and second time intervals responsive to respective ones of the first and second detected zero crossings.

9. An apparatus for testing an arc fault circuit interrupter, the apparatus comprising:
- an AC signal generator circuit configured to be coupled to an AC power line and to induce an AC signal thereon, said AC signal generator circuit comprising: a switch configured to selectively couple the AC power line to a ground node via a capacitor responsive to a switch control signal, and a drive circuit configured to generate the switch control signal responsive to an oscillating signal; and
- a control circuit configured to detect first and second immediately successive zero crossings of an AC power voltage of the AC power line and to disable generation of the AC signal for respective first and second time intervals responsive to respective ones of the first and second detected zero crossings.

10. The apparatus of claim 9, wherein the AC signal generator circuit further comprises a signal generator circuit configured to generate the oscillating signal.

11. The apparatus of claim 10, wherein the control circuit is configured to enable and disable the signal generator circuit to enable and disable generation of the AC signal on the AC power line.

12. The apparatus of claim 11, wherein the control circuit is configured to enable and disable a power supply to the signal generator circuit to enable and disable generation of the AC signal on the AC power line.

13. The apparatus of claim 12, wherein the control circuit comprises:
- a zero crossing detector circuit configured to detect the first and second zero crossing;
- a pulse generation circuit configured to generate first and second pulses responsive to respective ones of the first and second zero crossings; and
- a switching circuit configured to decouple a power supply input of the signal generator circuit from a power source responsive to the first and second pulses.

14. The apparatus of claim 9, wherein the AC signal generator circuit is configured to be capacitively coupled to the AC power line.

* * * * *